(12) United States Patent  
Hahm et al.

(10) Patent No.: US 9,570,705 B2
(45) Date of Patent: Feb. 14, 2017

(54) METHOD OF MANUFACTURING ORGANIC ELECTRONIC DEVICE

(71) Applicant: LG Display Co., Ltd., Seoul (KR)

(72) Inventors: Yun Hye Hahm, Daejeon (KR); Jung Hyoung Lee, Daejeon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/777,242

(22) PCT Filed: Sep. 30, 2014

(86) PCT No.: PCT/KR2014/009227
§ 371 (c)(1),
(2) Date: Sep. 15, 2015

(87) PCT Pub. No.: WO2015/047044
PCT Pub. Date: Apr. 2, 2015

(65) Prior Publication Data
US 2016/0035998 A1 Feb. 4, 2016

(30) Foreign Application Priority Data

Sep. 30, 2013 (KR) .................. 10-2013-0116489
Sep. 30, 2014 (KR) .................. 10-2014-0131934

(51) Int. Cl.
*H01J 1/62* (2006.01)
*H01L 51/52* (2006.01)
*H01L 51/10* (2006.01)
*H01L 51/44* (2006.01)
*H01L 27/32* (2006.01)
*H01L 51/05* (2006.01)
*H01L 51/56* (2006.01)

(52) U.S. Cl.
CPC ....... *H01L 51/5246* (2013.01); *H01L 27/3244* (2013.01); *H01L 51/102* (2013.01); *H01L 51/107* (2013.01); *H01L 51/448* (2013.01); *H01L 51/5203* (2013.01); *H01L 51/5253* (2013.01); *H01L 51/0508* (2013.01); *H01L 51/5256* (2013.01); *H01L 51/5268* (2013.01); *H01L 51/56* (2013.01); *H01L 2251/301* (2013.01); *H01L 2251/558* (2013.01); *Y02E 10/549* (2013.01)

(58) Field of Classification Search
CPC .................................................... H01L 51/5012
USPC ......................................... 313/504, 506, 498
See application file for complete search history.

(56) References Cited

U.S. PATENT DOCUMENTS

| | | | |
|---|---|---|---|
| 4,720,432 | A | 1/1988 | VanSlyke et al. |
| 6,226,890 | B1 | 5/2001 | Boroson et al. |
| 6,808,828 | B2 | 10/2004 | Ohata |
| 2004/0137142 | A1 | 7/2004 | Nishikawa |

(Continued)

FOREIGN PATENT DOCUMENTS

| CN | 101030628 A | 9/2007 |
|---|---|---|
| CN | 101309531 A | 11/2008 |

(Continued)

*Primary Examiner* — Vip Patel
(74) *Attorney, Agent, or Firm* — Dentons US LLP

(57) ABSTRACT

Provided are a method of manufacturing an organic electronic device (OED), an OED manufactured thereby, and a use of the OED. During a process of manufacturing an OED, exposure of a pad region may be efficiently performed in a simple process, thereby preventing permeation of a contaminant, and an OED manufactured by the method and a use of the OED may be provided.

16 Claims, 4 Drawing Sheets

(56) References Cited

U.S. PATENT DOCUMENTS

| | | |
|---|---|---|
| 2007/0054430 A1 | 3/2007 | Nishigaki |
| 2007/0102698 A1 | 5/2007 | Kang et al. |
| 2008/0224600 A1 | 9/2008 | Im et al. |
| 2008/0286895 A1 | 11/2008 | Hoshi et al. |
| 2009/0011678 A1 | 1/2009 | Morikawa et al. |
| 2009/0267507 A1 | 10/2009 | Takashima et al. |
| 2010/0003480 A1 | 1/2010 | Agata |
| 2010/0213828 A1 | 8/2010 | Seo et al. |
| 2012/0199825 A1 | 8/2012 | Soga et al. |
| 2013/0056714 A1 | 3/2013 | Hasegawa et al. |

FOREIGN PATENT DOCUMENTS

| | | |
|---|---|---|
| CN | 103258972 A | 8/2013 |
| JP | 1990-088689 A | 3/1990 |
| JP | 1990-191694 A | 7/1990 |
| JP | 1990-196885 A | 8/1990 |
| JP | 1990-250292 A | 10/1990 |
| JP | 1990-255789 A | 10/1990 |
| JP | 1990-289676 A | 11/1990 |
| JP | 1991-296595 A | 12/1991 |
| JP | 1992-096990 A | 3/1992 |
| JP | 1993-009470 A | 1/1993 |
| JP | 1993-017764 A | 1/1993 |
| JP | 1993-202011 A | 8/1993 |
| JP | 1994-049079 A | 2/1994 |
| JP | 1994-088072 A | 3/1994 |
| JP | 1994-092947 A | 4/1994 |
| JP | 1994-100857 A | 4/1994 |
| JP | 1994-107648 A | 4/1994 |
| JP | 1994-132080 A | 5/1994 |
| JP | 1994-145146 A | 5/1994 |
| JP | 1994-203963 A | 7/1994 |
| JP | 1994-206865 A | 7/1994 |
| JP | 1994-207170 A | 7/1994 |
| JP | 1994-279322 A | 10/1994 |
| JP | 1994-279323 A | 10/1994 |
| JP | 1994-293778 A | 10/1994 |
| JP | 1995-157473 A | 6/1995 |
| JP | 1995-179394 A | 7/1995 |
| JP | 1995-228579 A | 8/1995 |
| JP | 1995-278124 A | 10/1995 |
| JP | 1996-022557 A | 1/1996 |
| JP | 1996-081472 A | 3/1996 |
| JP | 2597377 B2 | 1/1997 |
| JP | 2000-145627 A | 5/2000 |
| JP | 2001-252505 A | 9/2001 |
| JP | 2002-151254 A | 5/2002 |
| JP | 2004-039553 A | 2/2004 |
| JP | 2004-165068 A | 6/2004 |
| JP | 2007-090803 A | 4/2007 |
| JP | 2008-515148 A | 5/2008 |
| JP | 2010-030295 A | 2/2010 |
| JP | 2010-199064 A | 9/2010 |
| JP | 2011-065799 A | 3/2011 |
| KR | 10-2003-0012157 A | 2/2003 |
| KR | 10-0559132 B1 | 3/2006 |
| KR | 10-2011-0063046 A | 6/2011 |
| KR | 10-2012-0072710 A | 7/2012 |
| KR | 10-2013-0018007 A1 | 2/2013 |
| TW | 201019477 A | 5/2010 |
| WO | 2012/165944 A1 | 12/2012 |
| WO | 2013/125352 A1 | 8/2013 |

METHOD OF MANUFACTURING ORGANIC ELECTRONIC DEVICE

This application is a National Stage Entry of International Application No. PCT/KR2014/009227, filed Sep. 30, 2014 and claims the benefit of the priority to Korean Application No. 10-2013-0116489, filed Sep. 30, 2013 and Korean Application No. 10-2014-0131934, filed Sep. 30, 2014, all of which are incorporated by reference in their entirety for all purposes as if fully set forth herein.

FILED

The present application relates to a method of manufacturing an organic electronic device (OED), an OED manufactured thereby, and a use of the OED.

BACKGROUND

Types of an OED include an organic light emitting device (OLED), an organic photovoltaic cell, an organic photo conductor (OPC), or an organic transistor.

Since the OED includes an organic layer vulnerable to an external factor such as water, structures capable of preventing permeation of an external material are disclosed, for example, in the patent documents 1 to 4.

Particularly, unlike a structure using a glass substrate having an excellent barrier property as a substrate, in a flexible structure using a polymer film as a substrate, prevention of the permeation of such an external material is a more important issue.

Accordingly, in the flexible structure, a process of forming a barrier layer on an entire surface of a device during the manufacture of the device may be required.

However, even when the barrier layer is formed on the entire surface, it is necessary to expose a pad region connected to an external circuit. Accordingly, while it is considered that a mask is used to form the barrier layer for exposure, the number of processes is increased, and therefore it is difficult to form a uniform barrier layer. Particularly, when atomic layer deposition (ALD) is applied as a method of forming a barrier layer having an excellent barrier property, it is not easy to apply a masking process due to the characteristics of the process. Alternatively, a process of adhering a pressure-sensitive adhesive sheet to the pad region before forming the barrier layer, and removing the pressure-sensitive adhesive sheet after forming the barrier layer may be considered (for example, refer to Reference 6).

However, according to the process, there is a very high probability to generate contamination of a pad region by the pressure-sensitive adhesive sheet, and therefore performance of a device is considerably degraded.

PRIOR ART DOCUMENTS

Paten Documents

Patent document 1: U.S. Pat. No. 6,226,890
Patent document 2: U.S. Pat. No. 6,808,828
Patent document 3: Japanese Patent Laid-Open No. 2000-145627
Patent document 4: Japanese Patent Laid-Open No. 2001-252505
Patent document 5: Japanese Patent No. 3861758
Patent document 6: Korean Patent Laid-Open No. 2012-0072710

DESCRIPTION

Object

The present application is directed to providing a method of manufacturing an OED, an OED manufactured thereby, and a use of the OED. In the present application, exposure of a pad region by a simple process may be efficiently performed during the process of manufacturing an OED, thereby preventing permeation of a contaminant, and an OED manufactured by the method and a use of the OED are provided.

Solution

In one aspect, the present application provides a method of manufacturing an OED, including performing masking by forming a polymer layer in a pad region to have a low cohesive property to the pad region during the formation of an inorganic material layer such as a barrier layer on a substrate having a device region and the pad region, and exposing the pad region through removal of the polymer layer after forming the inorganic material layer.

Accordingly, the method of the present application may include forming a first polymer film at least in a pad region of a substrate on which a device region including a first electrode layer, an organic layer, and a second electrode layer, which are sequentially stacked, and the pad region electrically connected to at least one of the first and second electrode layers are formed, forming an inorganic material layer on the substrate, and removing the first polymer film to expose the pad region.

Here, a type of the substrate having the device region and the pad region is not particularly limited, and known types may be applied.

FIG. 1 shows an illustrative substrate 101, which includes a device region 201 including a first electrode layer 2011, an organic layer 2012, and a second electrode layer 2013, and a pad region 301. An insulating layer defining an active region (for example, an emitting region) may be formed on the substrate according to a known method in the art.

The term "upward" used herein may refer to, unless particularly defined otherwise, a direction from the first electrode layer to the second electrode layer, and the term "downward" used herein may refer to, unless particularly defined otherwise, a direction from the second electrode layer to the first electrode layer.

Hereinafter, in the specification, for convenience of description, in the above structure, a region including all factors present under the first electrode layer may be a substrate region, and a region including all factors present on the first electrode layer, the second electrode layer, and therebetween may be a device region.

For the substrate 101 included in the substrate region, a known material may be used without particular limitation. For example, when a flexible device is realized as an OED, a material known to be conventionally used in realizing a flexible device in the art may be used to form a substrate. As a representative example of the substrate known to be used in realizing a flexible device, a thin glass film or polymer film is used. As the glass film, a film formed of soda lime glass, barium/strontium-containing glass, lead glass, alumino silicate glass, borosilicate glass, barium borosilicate glass, or quartz may be used, and as the polymer film, a film including polyimide (PI), polyethylene naphthalate (PEN), polycarbonate (PC), an acrylic resin, poly(ethylene terephthalate) (PET), poly(ether sulfide) (PES), or polysulfone (PS) may be used, but the present application is not limited thereto.

When the OED is an OLED designed to emit light generated from an organic layer to a substrate region, as the substrate, a light-transmitting film may be used. The term "light-transmitting film" may be, for example, a film having transmittance with respect to any one light in a visible region or light in an entire visible region of 50, 60, 70, or 80% or more. However, when light is designed to be emitted in a direction, not to the substrate region, a base film is not necessarily a light-transmitting film. When needed, a reflective layer may be formed of a reflective material such as aluminum on a surface of the film. When needed, the base film may be a thin film transistor (TFT) base film having a driving TFT.

When the polymer film is used as the substrate, the film may have a coefficient of thermal expansion (CTE) of 5 to 70 ppm/° C. As each layer constituting the OED may be formed of a material showing a different characteristic such as an expansion or contraction behavior, a defect may be generated by an external factor such as a temperature or humidity or bending of the device. Accordingly, to reduce or prevent such a defect, the CTE of the base film may be controlled. Here, another lower limit of the CTE may be approximately 10 ppm/° C., and another upper limit may be, for example, approximately 65, 60, 55, or 50 ppm/° C.

When the polymer film is used as the substrate, the film may have a glass transition temperature of 200° C. or more. Deposition or patterning, which may be performed at a high temperature, may be performed on the base film, and in this case, a glass transition temperature of the base film may be controlled within the above range in consideration of performance of a final device. The glass transition temperature may be, in another example, approximately 210, 220, 230, 240, or 250° C. or more. The upper limit of the glass transition temperature may be, but is not particularly limited to, for example, approximately 400, 350, or 300° C.

A root mean square (RMS) of the substrate may be controlled within a range of 0.1 to 5 nm. The structure of the OED includes a barrier layer on the substrate to ensure durability. When the barrier layer is directly formed on the substrate, since it is formed on a surface of the substrate in the above RMS range, performance of the barrier layer may be improved. The RMS may be, in another example, 4, 3, 2.5, or 2 nm or less.

When the OED is an OLED designed to emit light generated from the organic layer to the substrate region, the substrate may have a refractive index of approximately 1.5, 1.6, 1.7, or 1.75 or more. The term "refractive index" used herein is, unless particularly defined otherwise, a refractive index measured with respect to light having a wavelength of approximately 550 nm. As the refractive index of the substrate is controlled within the above range, for example, high light extraction efficiency may be maintained by a method of reducing probability of total reflection which may occur in a process of propagating light in the organic layer. The upper limit of the refractive index of the substrate may be, but is not particularly limited to, for example, approximately 2.0.

When needed, the substrate may have a haze. In this case, the haze of the substrate may be in a range of 3 to 90%. Another lower limit of the haze may be, for example, approximately 5 to 10%. In addition, another upper limit of the haze may be, for example, approximately 85, 80, 75, 70, 65, 60, 55, 50, 45, 40, 35, or 30%. A method of providing a haze to the substrate is not particularly limited, and a method conventionally applied to generate a haze may be applied. For example, in the case of the polymer film, a method of adding scattering particles having a different refractive index from a peripheral polymer matrix and a suitable average particle diameter, or a method of polymerizing a monomer allowing a polymer itself to exhibit a haze, for example, a monomer exhibiting a refractive index in a different range from that of a main chain of a polymer, and forming a film using such a polymer may be applied.

A thickness of the substrate is not particularly limited, and may be selected in a suitable range in consideration of a desired performance, for example, flexibility, light extraction efficiency, or a barrier property. For example, the thickness of the substrate may be in a range of approximately 10 to 50 or 20 to 30 μm.

The substrate region may include a barrier layer. Because of the characteristic of a material such as the glass substrate, unlike a rigid device to which a substrate having an excellent barrier property is applied, in a flexible device to which the polymer film having a poor barrier property is applied, the substrate region may need a barrier layer capable of blocking an external factor such as water permeating from the base film. The term "barrier property" may mean performance of preventing, inhibiting, or reducing the permeation of an external factor, for example, water or vapor, which can have a bad influence on the performance of the device such as an organic layer.

For example, the barrier layer may have a water vapor transmission rate (WVTR) of $10^{-4}$ g/m$^2$/day or less. In the specification, the WVTR may be a value measured using a measurer (for example, PERMATRAN-W3/31, MOCON, Inc.) at 40° C. and a relative humidity of 90%.

The barrier layer may be formed of any one of the materials known to reduce, prevent, or inhibit the permeation of the external factors such as water and oxygen. The material may be a metal such as In, Sn, Pb, Au, Cu, Ag, Al, Ti, or Ni; a metal oxide such as TiO, $TiO_2$, $Ti_3O_3$, $Al_2O_3$, MgO, SiO, $SiO_2$, GeO, NiO, CaO, BaO, $Fe_2O_3$, $Y_2O_3$, $ZrO_2$, $Nb_2O_3$, or $CeO_2$; a metal nitride such as SiN; a metal oxynitride such as SiON; a metal fluoride such as $MgF_2$, LiF, $AlF_3$, or $CaF_2$; a polyolefin such as polyethylene or polypropylene; poly((meth)acrylate) such as polymethyl(meth)acrylate; a polyimide; a polyurea; a fluorine-based polymer such as polytetrafluoroethylene, polychlorotrifluoroethylene, polydichlorodifluoroethylene, or a copolymer of chlorotrifluoroethylene and dichlorodifluoroethylene; an organic silicon formed from a material such as trivinyltrimethylcyclotrisiloxane (V3D3), hexamethyldisiloxane (HVDSO), or 1,3,5-trivinyl-1,1,3,5,5-pentamethyltrisiloxane (TVTSO); a fluorine-based polymer having a ring structure at a main chain; a copolymer of at least two monomers forming the above polymers; or a material known as an absorbing material having an absorbance of 1% or more or a waterproof material having an absorption coefficient of 0.1% or less.

The barrier layer may be formed in a monolayer or multilayer structure. In the case of the multilayer structure, the barrier layer may include a structure in which the same type or different types of inorganic material layers or organic materials are stacked, or a structure in which an inorganic material layer and an organic material layer are stacked. The multilayer structure is not necessarily formed of materials all having a barrier property, and as long as a finally formed multilayer structure exhibits a desired barrier property, some layers in the multilayer structure may not have a barrier property. The "inorganic material layer or organic material layer" used herein may not be a layer formed of only an inorganic or organic material, but may be a layer including an inorganic or organic material as a main component, for example, at an amount of 60 wt % or more or more than 60 wt %. The barrier layer may be formed in a multilayer structure to prevent propagation of a bond such as a pin hole which may be formed in the formation of the barrier layer, and to form a layer having a more excellent barrier property. In addition, the multilayer-structure barrier layer may be advantageous to form a barrier layer having a refractive index, which will be described below.

It is suitable that the barrier layer may have a smaller difference in refractive index, if possible, from the underlying substrate. For example, the absolute value of the difference in refractive index between the barrier layer and the substrate may be approximately 1, 0.7, 0.5, or 0.3 or less. Accordingly, when the substrate has a high refractive index as described above, the barrier layer may also have a refractive index at the same level. For example, the refractive index of the barrier layer may be approximately 1.5, 1.6, 1.7, or 1.75 or more. A high light extraction efficiency may be maintained by controlling the refractive index of the barrier layer within the above range, for example, by reducing probability of total reflection occurring while light propagates in the organic layer. The upper limit of the refractive index of the barrier layer may be, but is not particularly limited to, for example, approximately 2.0.

For example, the barrier layer may have a stack structure of a first sub layer having a first refractive index and a second sub layer having a second refractive index different from the first refractive index. When needed, the stack structure may be repeated twice or more. For example, to ensure the high refractive index as described above, as the first sub layer, a layer having a refractive index of 1.4 to 1.9 may be formed, and as the second sub layer, a layer having a refractive index of 2.0 to 2.6 may be formed. The barrier layer having the above refractive index may be formed by forming at least one first sub layer and at least one second sub layer. An example of the above structure may be a stack structure of an $Al_2O_3$ layer and a $TiO_2$ layer, but the present application is not limited.

A thickness of the barrier layer is not particularly limited, and may be suitably selected according to a predetermined use. For example, the barrier layer may have a thickness of 5 to 60 or 10 to 55 nm. When the barrier layer has a multilayer structure, the thickness of each sub layer in the multilayer structure may be, for example, approximately 0.5 to 10 or 0.5 to 5 nm.

To achieve an excellent barrier property and, when needed, a high refractive index, conditions for forming the barrier layer may be controlled. As a method of ensuring a high barrier property, a method of forming the barrier layer on a planarized surface, for example, having an RMS of 5, 4.5, 4.0, 3.5, 3.0, 2.5, 2.0, 1.5, 1.0, or 0.5 nm or less. As the barrier layer is formed on such a planarized surface, an excellent film quality is obtained, thereby forming a layer having an excellent barrier property. The RMS of the surface on which the barrier layer is formed may be controlled using a material having an excellent planarization degree, or using a buffer layer as to be described below. As another method of ensuring a high barrier property, a method of controlling a temperature during the formation of the barrier layer is used. That is, conventionally, the barrier layer may be formed by physical or chemical deposition, and in this process, when a deposition temperature is controlled at a high temperature, for example, 200° C. or more, although a planarization degree of the surface on which the barrier layer is formed is not controlled as described above, an excellent barrier property may be ensured.

As still another method of ensuring a high barrier property, a method of controlling formation of a barrier layer or a buffer layer becoming a surface on which the barrier layer is formed may be used. That is, conventionally, the barrier layer or buffer layer may be formed by physical vapor deposition (PVD) such as sputtering, pulsed laser deposition (PLD), electron beam evaporation, thermal evaporation, or laser molecular beam epitaxy (L-MBE), or by a chemical vapor deposition (CVD) such as metal organic chemical vapor deposition (MOCVD), hydride vapor phase epitaxy (HVPE), initiated chemical vapor deposition (iCVD), plasma enhanced chemical vapor deposition (PECVD), atomic layer deposition (ALD), or molecular layer deposition (MLD). The performance of the barrier layer or buffer layer may be maximized by selecting a suitable forming method according to a used material. To form a layer using the above-described material in the present application, CVD, particularly, ALD or iCVD may be applied. To ensure more suitable performance, ALD may be applied to form an inorganic material layer, and iCVD may be applied to form an organic material layer. The term "ALD layer" used herein refers to a layer formed by ALD, and the term "iCVD layer" used herein refers to a layer formed by iCVD.

The substrate region may include an additional layer. As the layer additionally present in the substrate region, a scattering layer, a buffer layer, a carrier substrate, a barrier film, or an adhesive layer may be used.

The buffer layer may be formed when a planarized surface is required when ensuring an interlayer cohesive property or forming a barrier layer. The buffer layer may be formed on the substrate, when a scattering layer to be described below is formed, on the scattering layer, or between the barrier layer and the first electrode layer, but the present application is not limited thereto. As to be described below, when needed, the buffer layer may also be formed in an upper region, and in the specification, for easy discrimination, the buffer layer formed in the substrate region may be a first buffer layer, and the buffer layer formed in the upper region may be a second buffer layer.

When light is generated from the organic layer, and the generated light is designed to be emitted to the substrate region, the buffer layer may be formed as a high refractive layer. The term "high refractive layer" used herein may be a layer having a refractive index of 1.6, 1.65, 1.7, or 1.75 or more. The upper limit of the refractive index of the high refractive layer may be, but is not particularly limited to, approximately 2.5 or 2.0.

A material for forming the buffer layer is not particularly limited as long as it can efficiently form a buffer layer and suitably ensure interlayer cohesion or a planarization degree. The buffer layer may be formed of, for example, a metal such as Al, an inorganic material such as SiOx, SiOxNv, SiNx, AlOx, ZnSnOx, ITO, ZnO, IZO, ZnS, MgO, or SnOx, a polyimide, a caldo resin having a fluorene ring, a urethane, an epoxide, a polyester, a poly(amic acid), a polyimide, a polyethyleneimine, a polyvinylalcohol, a polyamide, a polythiol, a poly((meth)acrylate), or an organic material such as organic silicon formed of trivinyltrimethylcyclotrisiloxane (V3D3), hexamethyldisiloxane (HVDSO), or 1,3,5-trivinyl-1,1,3,5,5-pentamethyltrisiloxane (TVTSO). In another example, the buffer layer may be formed of a material prepared by blending a compound of an alkoxide or acylate of a metal such as zirconium, titanium, or cerium with a binder having a polar group such as a carboxyl group or a hydroxyl group. The compound of the alkoxide or acylate may be condensed with the polar group of the binder, and include the metal in a backbone of the binder, thereby realizing a high refractive index. As an example of the alkoxide or acylate compound, a titanium alkoxide such as tetra-n-butoxy titanium, tetraisopropoxy titanium, tetra-n-propoxy titanium, or tetraethoxy titanium, titanium acylate such as titanium stearate, a titanium chelate, a zirconium alkoxide such as tetra-n-butoxy zirconium, tetra-n-propoxy zirconium, tetraisopropoxy zirconium, or tetraethoxy zirconium, a zirconium acylate such as zirconium tributoxystearate, or a zirconium chelate may be used.

The buffer layer may be formed by selecting a suitable material from the above-described materials. When the buffer layer requires a high refractive index, a material having a high refractive index selected from the above-described materials, or a material prepared by blending a suitable material selected therefrom with high refractive particles or by introducing a high refractive material such as a Ti precursor to the above material may be used. The term "high refractive particles" used herein may be, for example, particles having a refractive index of 1.5, 2.0, 2.5, 2.6, or 2.7 or more. The upper limit of the refractive index of the high refractive particles may be, for example, selected in the range which may satisfy a desired refractive index. The high refractive particles may have an average particle diameter of, for example, approximately 1 to 100, 10 to 90, 10 to 80, 10 to 70, 10 to 60, 10 to 50, or 10 to 45 nm. The high refractive particles may be alumina, alumino silicate, titanium oxide, or zirconium oxide. As the high refractive particles, for example, particles having a refractive index of 2.5 or more, rutile-type titanium oxide may be used. The rutile-type titanium oxide may have a relatively high refractive index, compared to common particles, and therefore can be controlled to have a desired refractive index even in a relatively small ratio.

A method of forming a buffer layer may be, but is not particularly limited to, for example, a suitable one of the PVD and CVD. In another example, the buffer layer may be formed by preparing a coating solution by blending a metal alkoxide such as titanium alkoxide or zirconium alkoxide with a solvent such as alcohol or water, applying the coating solution, and performing various wet or dry coating methods including a sol-gel coating method of plasticizing the coated solution at a suitable temperature after coating the coating solution.

The thickness of the buffer layer is not particularly limited, and may be suitably selected in consideration of a position at which the buffer layer is formed and required functions. For example, when the buffer layer is formed on the scattering layer to ensure a planarized surface, it may have a relatively large thickness, compared to when the buffer layer is formed on the substrate.

The substrate region may further include a scattering layer to ensure a suitable haze in the substrate region. The term "scattering layer" used herein may be all types of layers formed to scatter, refract, or diffract light incident on the layer. A shape of the scattering layer realized to have the above-described function is not particularly limited, and the scattering layer may be realized using the known material and method.

As another layer included in the substrate region, a barrier film may be used. Compared to a rigid structure using a substrate having an excellent barrier property of the properties of the material such as a glass substrate, in a flexible structure, a substrate having a relatively low barrier property may be applied and therefore, to compensate the barrier property, an additional barrier film may be present, for example, under the substrate. As the barrier film, one which can ensure a suitable barrier property and light transmittance when needed may be used without particular limitation.

The barrier film may be adhered to the substrate, for example, by an adhesive layer. The term "adhesive layer" used herein may include a material conventionally referred to as an adhesive, and a layer formed of a material called as a pressure-sensitive adhesive or a material called as a pressure-sensitive adhesive/adhesive. The material for forming the adhesive layer may be, but is not particularly limited to, for example, a known pressure-sensitive adhesive/adhesive material such as an acrylic polymer, a silicon polymer, a rubber-based polymer, an ethylene vinyl acetate (EVA) polymer, or an olefin polymer such as polyisobutylene (PIB).

When needed, a suitable water-proof material may be blended in the adhesive layer. Hereinafter, in the specification, the adhesive layer blended with the water-proof material may be referred to as an adhesive layer having a barrier property. The term "water-proof material" used herein may be a component capable of adsorbing or removing water or vapor permeated from an external environment through a physical or chemical reaction. A specific type of the water-proof material capable of being blended in the adhesive layer may be, but is not particularly limited to, for example, one or a mixture of at least two of a metal oxide, an organic metal oxide, a metal salt, and phosphorus pentoxide ($P_2O_5$). Here, a specific example of the metal oxide may be, but is not limited to, lithium oxide ($Li_2O$), sodium oxide ($Na_2O$), barium oxide (BaO), calcium oxide (CaO), or magnesium oxide (MgO), and the metal salt may be, but is not limited to, a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), or nickel sulfate ($NiSO_4$); a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_1$), or magnesium iodide ($MgI_2$); or a metal chlorate such as barium perchlorate ($Ba(ClO_4)_2$) or magnesium perchlorate ($Mg(ClO_4)_2$).

When needed, suitable scattering particles may be blended in the adhesive layer, and thus the adhesive layer may exhibit a suitable haze. When the adhesive layer exhibits a haze, light extraction efficiency may be improved. A type of the scattering particles which may be blended with the adhesive layer is not particularly limited, and a suitable type may be selected from the scattering particles included in the scattering layer in consideration of the refractive index of a resin for forming the adhesive layer.

As another layer which may be present in the substrate region, a carrier substrate which may be temporarily or permanently adhered under the base film may be used. Conventionally, as the carrier substrate, a rigid substrate such as a glass substrate may be used.

The substrate region which may include components as described above may be formed in various structures. For example, the substrate region may have a structure in which a barrier layer and a substrate are sequentially formed downward, a structure in which a barrier layer, a buffer layer, and a substrate are sequentially formed downward, a structure in which a barrier layer, a scattering layer, and a substrate are sequentially formed downward, or a structure in which a barrier layer, a buffer layer, a scattering layer, and a substrate are sequentially formed downward. In addition, the substrate region may include a structure in which a carrier substrate is formed under a substrate or a structure in which an adhesive layer which may include a water-proof material and/or scattering particles and a barrier film are sequentially formed under a substrate.

The device region present on the substrate region may include a first electrode layer and a second electrode layer, and also include an organic layer present between the first and second electrode layers. Here, each of the first and second electrode layers may be a hole injection or electron injection electrode layer conventionally used in the OED. Conventionally, any one of the first and second electrode layers may be formed as a hole injection electrode layer, and the other one thereof may be formed as an electron injection electrode layer. In addition, conventionally, any one of the first and second electrode layers may be formed as a transparent electrode layer, and the other one thereof may be formed as a reflective electrode layer.

The hole injection electrode layer may be formed of, for example, a material having a relatively high work function, or when needed, formed of a transparent or reflective material. For example, the hole injection electrode layer may include a metal, an alloy, or an electro conductive compound having a work function of approximately 4.0 eV or more, or a mixture of at least two thereof. Such a material may be a metal such as gold, CuI, indium tin oxide (ITO), indium zinc oxide (IZO), zinc tin oxide (ZTO), an aluminum- or indium-doped zinc oxide, magnesium indium oxide, nickel tungsten oxide, an oxide material such as ZnO, $SnO_2$, or $In_2O_3$, a metal nitride such as gallium nitride, a metal selenide such as zinc selenide, or a metal sulfide such as zinc sulfide. A transparent hole injection electrode layer may also be formed using a stack structure of a metal thin film such as Au, Ag, or Cu and a high refractive transparent material such as ZnS, $TiO_2$, or ITO.

The hole injection electrode layer may be formed by an optional means such as deposition, sputtering, chemical deposition, or electrochemical means. In addition, when needed, the formed electrode layer may be patterned through known photolithography or a process using a shadow mask.

The electron injection electrode layer may be formed, for example, using a material having a relatively low work function, and may be formed using a suitable transparent or reflective material among the materials used to form the hole injection electrode layer, but the present application is not limited thereto. The electron injection electrode layer may also be formed by, for example, deposition or sputtering, or may be suitably patterned when needed.

The electrode layer may be formed to have a thickness of, for example, approximately 90 to 200, 90 to 180, or 90 to 150 nm.

An organic layer is present between the first and second electrode layers. The organic layer may include at least two emitting units. In such a structure, light generated from the emitting unit may be emitted to a transparent electrode layer through reflection by a reflective electrode layer.

The organic layer may include a first emitting unit having a first emission center wavelength and a second emitting unit having a second emission center wavelength, and when needed, may also include another emitting unit. In addition, when the organic layer is formed in a structure including a plurality of emitting units as described above, for suitable emission, an intermediate electrode layer or a charge generating layer (CGL) may be additionally present between the emitting units. Accordingly, the emitting units may be divided by the intermediate electrode layer or charge-generating layer having a charge-generating characteristic.

A material constituting the emitting unit is not particularly limited. Fluorescent or phosphorescent organic materials having various emission center wavelengths are known in the art, and a suitable type may be selected from such known materials, thereby forming the emitting unit. The material for the emitting unit may be, but is not limited to, an Alq-based material such as tris(4-methyl-8-quinolinolate) aluminum(III) (Alg3), 4-MAlq3, or Gaq3; a cyclopentadiene derivative such as C-545T($C_{26}H_{26}N_2O_2S$), DSA-amine, TBSA, BTP, PAP-NPA, spiro-FPA, PhTDAOXD ($Ph_3Si$), or 1,2,3,4,5-pentaphenyl-1,3-cyclopentadiene (PPCP); 4,4'-bis (2,2'-diphenylvinyl)-1,1'-biphenyl (DPVBi), distyrylbenzene, or a derivative thereof; 4-(dicyanomethylene)-2-tert-butyl-6-(1,1,7,7,-tetramethyljulolidyl-9-enyl)-4H-pyran (DCJTB), DDP, AAAP, or NPAMLI; or a phosphorescent material such as Firpic, m-Firpic, N-Firpic, $bon_2Ir(acac)$, $(C_6)_2Ir(acac)$, $bt_2Ir(acac)$, $dp_2Ir(acac)$, $bzq_2Ir(acac)$, $bo_2Ir(acac)$, $F_2Ir(bpy)$, $F_2Ir(acac)$, $op_2Ir(acac)$, $ppy_2Ir(acac)$, $tpy_2Ir(acac)$, fac-tris[2-(4,5'-difluorophenyl)pyridine-C'2,N] iridium(III) (FIrppy), or bis(2-(2'-benzo[4,5-a]thienyl) pyridinato-N,C3') iridium(acetylactonate) ($Btp_2Ir(acac)$). The emitting unit may include the above material as a host, and a host-dopant system including perylene, distyrylbiphenyl, DPT, quinacridone, rubrene, BTX, ABTX, or DCJTB as a dopant.

The emitting unit may also be formed by employing a suitable one exhibiting an emitting characteristic selected from electron accepting organic compounds or electron donating organic compounds, which will be described below.

The organic layer may be formed in various structures further including various functional layers known in the art, as long as it includes the emitting unit. As a layer capable of being included in the organic layer, an electron injection layer, a hole blocking layer, an electron transport layer, a hole transport layer, or a hole injection layer may be used.

The electron injection layer or electron transport layer may be formed using, for example, an electron accepting organic compound. Here, as the electron accepting organic compound, a known optional compound may be used without particular limitation. As such an organic compound, a polycyclic compound such as p-terphenyl or quaterphenyl, or a derivative thereof; a polycyclic hydrocarbon compound such as naphthalene, tetracene, pyrene, coronene, chrysene, anthracene, diphenylanthracene, naphthacene, or phenanthrene, or a derivative thereof; or a heterocyclic compound such as phenanthroline, bathophenanthroline, phenanthridine, acridine, quinoline, quinoxaline, or phenazine, or a derivative thereof may be used. In addition, fluoroceine, perylene, phthaloperylene, naphthaloperylene, perynone, phthaloperynone, naphthaloperynone, diphenylbutadiene, tetraphenylbutadiene, oxadiazole, aldazine, bisbenzoxazoline, bisstyryl, pyrazine, cyclopentadiene, oxine, aminoquinoline, imine, diphenylethylene, vinylanthracene, diaminocarbazole, pyrane, thiopyrane, polymethine, merocyanine, quinacridone, rubrene or a derivative thereof, a metal chelate complex compound disclosed in a patent publication such as Japanese Patent Laid-Open Application No. 1988-295695, Japanese Patent Laid-Open Application No. 1996-22557, Japanese Patent Laid-Open Application No. 1996-81472, Japanese Patent Laid-Open Application No. 1993-009470, or Japanese Patent Laid-Open Application No. 1993-017764, for example, a metal complex having at least one of metal chelated oxinoid compounds such as 8-quinolinolatos including tris(8-quinolinolato)aluminum, bis(8-quinolinolato)magnesium, bis[benzo(f)-8-quinolinolato]zinc,bis(2-methyl-8-quinolinolato)aluminum, tris(8-quinolinolato)indium, tris(5-methyl-8-quinolinolato)aluminum, 8-quinolinolatolithium, tris(5-chloro-8-quinolinolato)gallium, bis(5-chloro-8-quinolinolato)calcium, and derivatives thereof as a coordinator; an oxadiazole compound disclosed in a patent publication such as Japanese Patent Laid-Open Application No. 1993-202011, Japanese Patent Laid-Open Application No. 1995-179394, Japanese Patent Laid-Open Application No. 1995-278124, or Japanese Patent Laid-Open Application No. 1995-228579; a triazine compound disclosed in a patent publication such as Japanese Patent Laid-Open Application No. 1995-157473; a stilbene derivative disclosed in a patent publication such as Japanese Patent Laid-Open Application No. 1994-203963; a distyrylarylene derivative; a styryl derivative disclosed in a patent publication such as Japanese Patent Laid-Open Application No. 1994-132080 or Japanese Patent Laid-Open Application No. 1994-88072; a diolefin derivative disclosed in a patent publication such as Japanese Patent Laid-Open Application No. 1994-100857 or Japanese Patent Laid-Open Application No. 1994-207170; a fluorescent brightening agent such as a benzooxazole compound, a benzothiazole compound, or a benzoimidazole compound; a distyrylbenzene compound such as 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzyl, 1,4-bis(3-ethylstyryl)benzene, 1,4-bis(2-methylstyryl)-2-methylbenzene, or 1,4-bis(2-methylstyryl)-2-ethylbenzene; a distyrylpyrazine compound such as 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine, or 2,5-bis[2-(1-pyrenyl)vinyl]pyrazine; a dimethylidine compound such as 1,4-phenylenedimethylidine, 4,4'-phenylenedimethylidine, 2,5-xylene dimethylidine, 2,6-naphthylenedimethylidine, 1,4-biphenylenedimethylidine, 1,4-para-terephenylene dimethylidine, 9,10-anthracenediyldimethylidine, or 4,4'-(2,2-di-ti-butylphenylvinyl)biphenyl or 4,4'-(2,2-diphenylvinyl)biphenyl, or a derivative thereof; a silanamine derivative disclosed in a patent publication such as Japanese Patent Laid-Open Application No. 1994-49079 or Japanese Patent Laid-Open Application No. 1994-293778; a multifunctional styryl compound disclosed in a patent publication such as Japanese Patent Laid-Open Application No. 1994-279322 or Japanese Patent Laid-Open Application No. 1994-279323; an oxadiazole derivative disclosed in a patent publication such as Japanese Patent Laid-Open Application No. 1994-107648 or Japanese Patent Laid-Open Application No. 1994-092947; an anthracene compound disclosed in a patent publication such as Japanese Patent Laid-Open Application No. 1994-206865; an oxinate derivative disclosed in a patent publication such as Japanese Patent Laid-Open Application No. 1994-145146; a tetraphenyl butadiene compound disclosed in a patent publication such as Japanese Patent Laid-Open Application No. 1992-96990; an organic trifunctional compound disclosed in a patent publication such as Japanese Patent Laid-Open Application No. 1991-296595; a coumarin derivative disclosed in a patent publication such as Japanese Patent Laid-Open Application No. 1990-191694; a perylene derivative disclosed in a patent publication such as Japanese Patent Laid-Open Application No. 1990-196885; a naphthalene derivative disclosed in a patent publication such as Japanese Patent Laid-Open Application No. 1990-255789; a phthaloperynone derivative disclosed in a patent publication such as Japanese Patent Laid-Open Application No. 1990-289676 or Japanese Patent Laid-Open Application No. 1990-88689; or a styryl amine derivative disclosed in a patent publication such as Japanese Patent Laid-Open Application No. 1990-250292 may be used as an electron accepting organic compound included in the low refractive layer. In addition, here, the electron injection layer may be formed using, for example, a material such as LiF or CsF.

The hole blocking layer may be a layer capable of enhancing a lifespan and efficiency of the device by preventing approach of injected holes to an electron injection electrode layer through the emitting unit, and may be formed in a suitable part between the emitting unit and the electron injection electrode layer using a known material when needed.

The hole injection layer or hole transport layer may include, for example, an electron donating organic compound. As the electron donating organic compound, N,N',N'-tetraphenyl-4,4'-diaminophenyl, N,N'-diphenyl-N,N'-di(3-methylphenyl)-4,4'-diaminobiphenyl, 2,2-bis(4-di-p-tolylaminophenyl)propane, N,N,N',N'-tetra-p-tolyl-4,4'-diaminobiphenyl, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino)quadriphenyl, 4-N,N-diphenylamino-(2-diphenylvinyl)benzene, 3-methoxy-4'-N,N-diphenylaminostyrylbenzene, N-phenylcarbazole, 1,1-bis(4-di-p-triaminophenyl)cyclohexane, 1,1-bis(4-di-p-triaminophenyl)-4-phenylcyclohexane, bis(4-dimethylamino-2-methylphenyl)phenylmethane, N,N,N-tri(p-tolyl)amine, 4-(di-p-tolylamino)-4'-[4-(di-p-tolylamino)styryl]stilbene, N,N,N',N'-tetraphenyl-4,4'-diaminobiphenyl N-phenylcarbazole, 4,4'-bis[N-(1-naphthyl)-N-phenylamino]biphenyl, 4,4"-bis[N-(1-naphthyl)-N-phenylamino]p-terphenyl, 4,4'-bis[N-(2-naphthyl)-N-phenylamino]biphenyl, 4,4'-bis[N-(3-acenaphthenyl)-N-phenylamino]biphenyl, 1,5-bis[N-(1-naphthyl)-N-phenylamino]naphthalene, 4,4'-bis[N-(9-anthryl)-N-phenylamino]biphenylphenylamino]biphenyl, 4,4"-bis[N-(1-anthryl)-N-phenylamino]-p-terphenyl, 4,4'-bis[N-(2-phenanthryl)-N-phenylamino]biphenyl, 4,4'-bis[N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino]biphenyl, 2,6-bis(di-p-tolylamino)naphthalene, 2,6-bis[di-(1-naphthyl)amino]naphthalene, 2,6-bis[N-(1-naphthyl)-N-(2-naphthyl)amino]naphthalene, 4,4"-bis[N,N-di(2-naphthyl)amino]terphenyl, 4,4'-bis{N-phenyl-N-[4-(1-naphthyl)phenyl]amino}biphenyl, 4,4'-bis[N-phenyl-N-(2-pyrenyl)amino]biphenyl, 2,6-bis[N,N-di-(2-naphthyl)amino]fluorene, or 4,4"-bis(N,N-di-p-tolylamino)terphenyl, or an aryl amine compound such as bis(N-1-naphthyl)(N-2-naphthyl)amine may be used, but the present application is not limited thereto.

The hole injection layer or hole transport layer may be formed by dispersing an organic compound in a polymer, or using a polymer derived from the organic compound. In addition, a π-conjugated polymer such as polyparaphenylenevinylene or a derivative thereof, a hole transport non-conjugated polymer such as poly(N-vinylcarbazole), or a a-conjugated polymer of polysilane may also be used.

The hole injection layer may be formed using an electrically-conductive polymer such as a metal phthalocyanine such as copper phthalocyanine or a non-metal phthalocyanine, a carbon film, and polyaniline, or may be formed by reaction with a Lewis acid using the aryl amine compound as an oxidizing agent.

A particular structure of the organic layer is not particularly limited. Various materials and methods for forming a hole or electron injection electrode layer and an organic layer, for example, an emitting layer, an electron injection or transport layer, or a hole injection or transport layer are known in the art, and to manufacture the OED, all of the methods may be used.

In the manufacturing method of the present application, a process of forming a first polymer film on the substrate having the device region and the pad region as described above is included. Here, the polymer film may be formed on an entire surface of the substrate including the device region and the pad region, or only on the pad region, but only on the pad region in terms of process efficiency. To form the first polymer film only on the pad region, for example, a suitable masking process may be used in a process of forming a polymer film to be described below.

The first polymer film may be formed using a material that has a decreased adhesive strength with the pad region, or is not adhered to the pad region.

Conventionally, in consideration that the pad region is formed by extending the described first or second electrode layer, as the above material, a polymer material having hydrophobicity may be used.

A polymer material that shows a low adhesive strength to the pad region since having hydrophobicity, or does not show an adhesive strength may be easily considered in the art, and for example, such a material may be a polymer material including a hydrocarbon group substituted by a halogen (halogenated hydrocarbon group) or a hydrophobic functional group such as a hydrocarbon group.

The term "hydrocarbon group" used herein may be, unless particularly defined otherwise, a monovalent residue induced from a compound composed of carbon and hydrogen or a derivative thereof. For example, the hydrocarbon group may include 1 to 25 carbon atoms. As the hydrocarbon group, an alkyl group, an alkenyl group, an alkynyl group, or an aryl group may be used. A polymer including a functional group in which at least one halogen atom is substituted to the hydrocarbon group as described above, that is, a halogenated hydrocarbon group, in a suitable ratio exhibits hydrophobicity, and shows a low adhesive property to a material conventionally applied to manufacture a pad region. Here, a type of the halogen atom which may be substituted to the hydrocarbon group may not be particularly limited, and for example, a fluorine group may be substituted to the hydrocarbon group.

Meanwhile, the term "alkyl group" used herein may be, unless particularly defined otherwise, an alkyl group having 1 to 20, 1 to 16, 1 to 12, 1 to 8, or 1 to 4 carbon atoms. The alkyl group may be a linear, branched, or cyclic type. In addition, the alkyl group may be optionally substituted with at least one substituent.

The term "alkenyl group" used herein may be, unless particularly defined otherwise, an alkenyl group having 2 to 20, 2 to 16, 2 to 12, 2 to 8, or 2 to 4 carbon atoms. The alkenyl group may be a linear, branched, or cyclic type, and may be optionally substituted with at least one substituent.

The term "alkynyl group" used herein may be, unless particularly defined otherwise, an alkynyl group having 2 to 20, 2 to 16, 2 to 12, 2 to 8, or 2 to 4 carbon atoms. The alkynyl group may be a linear, branched, or cyclic type, and may be optionally substituted with at least one substituent.

The term "aryl group" used herein may be, unless particularly defined otherwise, a monovalent residue derived from a compound including a structure in which a benzene ring is included, or at least two benzene rings are connected, or at least two benzene rings are condensed or bound to each other with sharing one or at least two carbon atoms, or a derivative thereof. In the range of the aryl group described in the specification may include a functional group conventionally called as an aryl group, and an aralkyl group or arylalkyl group. The aryl group may be, for example, an aryl group having 6 to 25, 6 to 21, 6 to 18, or 6 to 12 carbon atoms. The aryl group may be a phenyl group, a dichlorophenyl group, a chlorophenyl group, a phenylethyl group, a phenylpropyl group, a benzyl group, a tolyl group, a xylyl group, or a naphthyl group.

A ratio of the substituent of a main backbone of the polymer or a halogenated hydrocarbon group may be suitably selected in consideration of an adhesive property to the pad region without particular limitation.

For example, the polymer may be a polymer formed of a monomer component such as a compound of Formula 1:

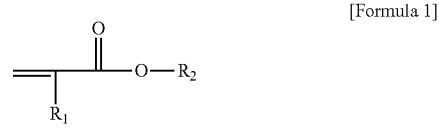

[Formula 1]

In Formula 1, $R_1$ is hydrogen or an alkyl group, and $R_2$ is a hydrocarbon group which is not substituted or substituted by at least one halogen atom.

A method of forming the polymer in the method according to the present application is not particularly limited. However, in consideration of easiness of a process of forming a uniform polymer film and a subsequent removing process, the polymer film may be formed by initiated chemical vapor deposition (iCVD). The iCVD may be vapor deposition of a polymer using an initiator, thereby easily forming an uniform polymer film. In the present application, a method of forming the polymer film through the iCVD may be performed by a known method without particular limitation. However, to prevent contamination by the permeation of an external material, it is preferable that the iCVD is performed in a vacuum condition. Here, the vacuum condition does not mean a complete vacuum condition but includes a vacuum condition conventionally considered as a vacuum condition, and for example, a condition having a pressure of approximately 200 mT to 1 T. However, the condition is illustrative, and is not particularly limited as long as it is maintained in a range capable of preventing an external contamination.

As the polymer film is formed by the iCVD described above, a desired polymer film may be efficiently formed at least in a pad region.

In consideration of a suitable masking effect and subsequent easy removal, a thickness of the polymer film may be controlled. For example, the polymer film may be formed to have a thickness of approximately 100 or 150 nm or more. In addition, the polymer film may have a thickness of approximately 1,000, 900, 800, 700, or 600 nm or less. A range of the thickness may be changed in consideration of a desired masking effect or easy removal.

FIG. 2 shows a polymer film 401 formed in the pad region by the method described above.

An inorganic material layer may be formed after the above-described process. Here, the inorganic material layer may be, for example, a barrier layer, and various inorganic material layers may be additionally formed according to required functions. Meanwhile, the term "inorganic material layer" used herein may be, for example, a layer including an inorganic material at 50% or more or 60% based on a weight. The inorganic material layer may include only an inorganic material, and also include another component such as an organic material when the inorganic material is included within the above range.

The inorganic material layer may be formed in an entire region of the substrate including the first polymer film.

A method of forming an inorganic material layer may be formed by a known method without particular limitation. For example, when the barrier layer is formed as the inorganic material layer, the inorganic material layer may be formed in the substrate region using the above-described device and method, and preferably the inorganic material layer may be formed by atomic layer deposition (ALD).

FIG. 3 shows an inorganic material layer 501 formed by the method as described above.

In this process, subsequently, the first polymer film may be removed to expose the pad region. That is, when the inorganic material layer is formed by the above-described method, the first polymer film, which may be easily removed from the pad region, is present between the pad region and the inorganic material layer, and thus only the pad region may be effectively exposed.

In this process, a method of removing the first polymer film may be, but is not particularly limited to, for example, a method of adhering and delaminating a pressure-sensitive adhesive sheet or adhesive sheet on the formed inorganic material layer, an etching method using an etchant for selectively etching the first polymer film, or a laser patterning method.

FIG. 4 is a diagram showing that the pad region is exposed through the above-described process.

In the manufacturing method as described above, as an additional process, a process of forming a second polymer film in the device region before forming an inorganic material layer may be performed. That is, for example, another polymer film capable of exhibiting an excellent cohesive property to the inorganic material layer, unlike the first polymer film, is formed in the device region, thereby increasing efficiency of the process, and enabling the manufacture of a device having more excellent durability.

As the material capable of being used in this process, any one showing an excellent cohesive property to the inorganic material layer may be used without particular limitation. For example, when the inorganic material layer is formed by ALD, the second polymer film may be formed using a hydrophilic material known to show an excellent cohesive property with the ALD layer.

Such polymer films may be polymer films including a functional group such as a hydroxyl group, an epoxy group, an amino group, or a carboxyl group.

A ratio of the substituent such as the main backbone of the polymer or a hydroxyl group may be suitably selected in consideration of an adhesive property to an inorganic material without particular limitation.

For example, the second polymer film may be, but is not limited to, a carboxyl group-containing monomer such as a hydroxyalkyl (meth)acrylate such as 2-hydroxyethyl (meth)acrylate, 2-hydroxypropyl (meth)acrylate, 4-hydroxybutyl (meth)acrylate, 6-hydroxyhexyl (meth)acrylate, or 8-hydroxyoctyl (meth)acrylate, a hydroxypolyalkyleneglycol (meth)acrylate such as 2-hydroxypolyethyleneglycol (meth)acrylate or 2-hydroxypolypropyleneglycol (meth)acrylate, (meth)acrylic acid, 2-(meth)acryloyloxy acetic acid, 3-(meth)acryloyloxy propylic acid, 4-(meth)acryloyloxy butyric acid, an acrylic acid dimer, itaconic acid, maleic acid, or a maleic acid anhydride; a glycidyl group-containing monomer such as glycidyl (meth)acrylate; or an amide-based monomer such as (meth)acrylamide.

In the present application, a method of forming the second polymer film may be, but is not particularly limited to, iCVD, which is the same as that for the first polymer film.

The manufacturing process of the present application may also include another process known to be applied to improve performance of the OED when needed, as long as the main step as described above is included.

In another aspect, the present application provides an OED manufactured by the above-described method. In the method, since a pad region is exposed after forming a first polymer layer in the pad region, the OED may include the first polymer layer at least in the pad region.

Accordingly, the OED may include a substrate on which a device region including a first electrode layer, an organic layer, and a second electrode layer, which are sequentially stacked, and a pad region electrically connected to the first or second electrode layer are formed; an inorganic material layer formed in the device region of the substrate; and the first polymer layer formed in the pad region of the substrate.

Detailed description of the OED is the same as described above.

Accordingly, in the OED, the inorganic material layer may be an ALD film, and in one example, may be a barrier layer.

In addition, in the OED, the first polymer layer may include the above-described halogen-substituted hydrocarbon group or hydrocarbon group. In addition, the second polymer film, that is, a polymer film including the compound of Formula 1 or a polymerization unit thereof may also be formed in the OED.

In addition, the OED may include the second polymer film between the device region and the inorganic material layer.

Descriptions of the other components for the device may be applied as described above.

In still another aspect, the present application provides a use of the OED, for example, an OLED. The OLED may be effectively applied to a backlight of a liquid crystal display (LCD), lightings, sensors, a light source of a printer or copy machine, a light source for an automobile gauge, a signal light, a pilot lamp, a display device, a light source for a planar emitting device, a display, decorations, or other kinds of lights. In one embodiment, the present application relates to a lighting device including the OLED. When the OLED is applied to the lighting device or for different uses, another component constituting the device or a method of constituting the device is not particularly limited, but all of optional materials or methods known in a corresponding field may be employed as long as the OLED is used.

Effect

According to the present application, a method of efficiently exposing a pad region in a simple process in manufacturing an OED, thereby preventing permeation of a contaminant, an OED manufactured by the method, and a use of the OED can be provided.

DETAILED DESCRIPTION OF EMBODIMENTS

Hereinafter, illustrative embodiments of the present application will be described in detail with reference to Examples according to the present application and Comparative Examples not according to the present application. However, the scope of the present application is not limited to the embodiments to be disclosed below.

EXAMPLE 1

Figure 1:
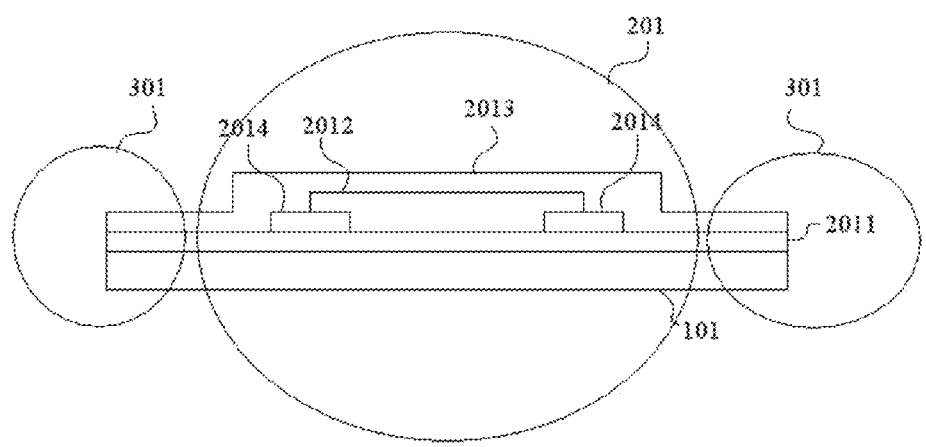
FIGS. 1 to 4 are schematic diagrams showing steps of an illustrative method of manufacturing an OED according to the present application.

A substrate 101 on which a device region 201 including a first electrode layer 2011, an organic layer 2012, and a second electrode layer 2013, which were sequentially stacked as shown in FIG. 1, and a pad region 301 are formed was used. Here, the device region and the pad region were manufactured by a known method. First, as the substrate 101, a flexible substrate, that is, a polyimide (PI) film, was disposed on a carrier substrate, that is, a glass substrate, and a barrier layer was formed on the PI film. The barrier layer was formed by alternately depositing an Al$_2$O$_3$ layer having a refractive index in single deposition of approximately 1.6 to 1.8 and a TiO$_2$ layer having a refractive index in single deposition of approximately 2.0 to 2.4 by ALD, thereby finally obtaining a refractive index of approximately 1.8. The Al$_2$O$_3$ layer was formed by alternately adsorbing a trimethylaluminum layer and a water (H$_2$O) layer as precursors at approximately 200° C. by known ALD, and the TiO$_2$ layer was formed by alternately adsorbing a TiCl$_4$ layer and a water (H$_2$O) layer as precursors at approximately 200° C. by the known ALD. During the formation, as each of the Al$_2$O$_3$ layer and the TiO$_2$ layer was formed to have a thickness of approximately 2 to 5 nm, thereby finally forming a barrier layer having a thickness of approximately 40 nm. Subsequently, a hole injection transparent electrode layer, a hole transport layer, a first emitting unit having an emission wavelength of approximately 380 to 500 nm, an n-type organic semiconductor layer, a p-type organic semiconductor layer, a second emitting unit having an emission wavelength of approximately 500 to 700 nm, a hole blocking layer, an electron transport layer, an electron injection layer, and an electron injection reflective electrode layer were sequentially formed on the barrier layer using a known material, thereby forming a device region and a pad region.

Figure 2:
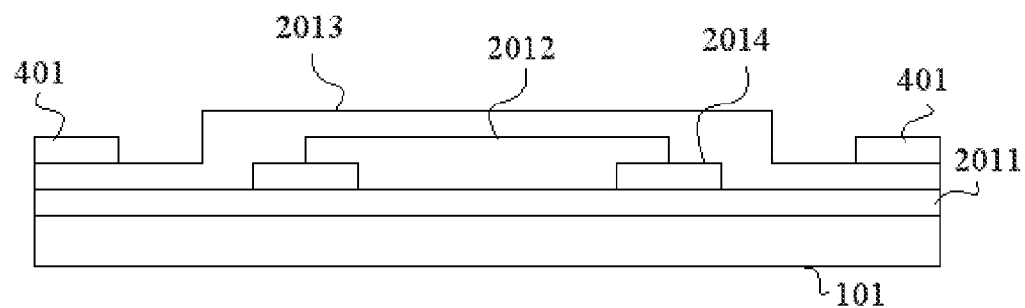

Subsequently, a first polymer layer 401 was formed in the pad region using a masking process through iCVD as shown in FIG. 2. The iCVD layer was formed using a compound of Formula A as a monomer, and t-butylperoctoate (TBPO) as an initiator. The iCVD layer was formed to have a thickness of approximately 200 nm by thermally decomposing the initiator in the mixture of the monomer and the initiator using a filament maintained at a temperature of approximately 350° C., and inducing polymerization on a surface of the pad region in a vacuum chamber maintained at a temperature of approximately 30 to 50° C.

Figure 3:
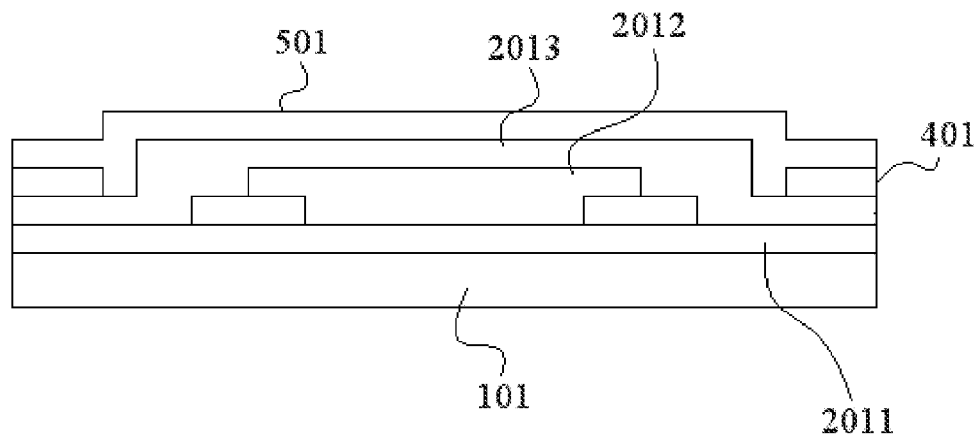
Figure 4:
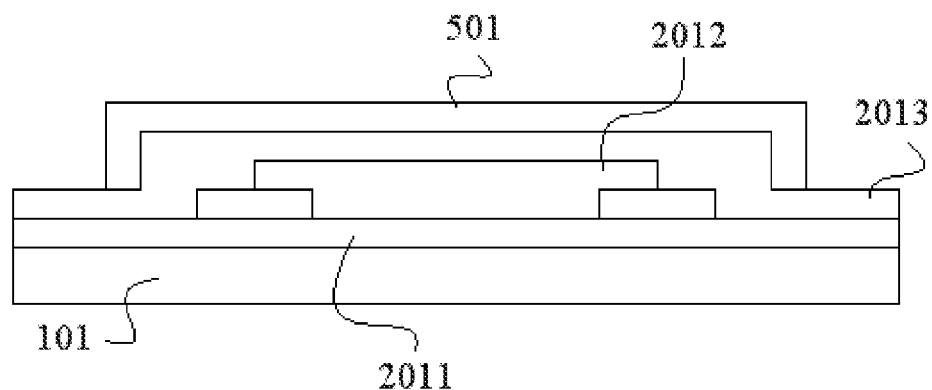

Subsequently, an inorganic material layer 501 was formed as a barrier layer on an entire surface of the substrate including the first polymer layer by ALD as shown in FIG. 3. The barrier layer was manufactured by forming an Al$_2$O$_3$ layer according to the above-described method. Afterward, a pressure-sensitive adhesive tape was adhered to a surface of the ALD layer and delaminated, and thus removed the ALD layer with the first polymer layer in the pad region, resulting in manufacturing a device shown in FIG. 4.

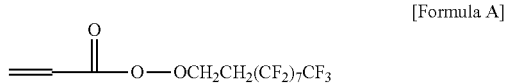

[Formula A]

Figure 5:
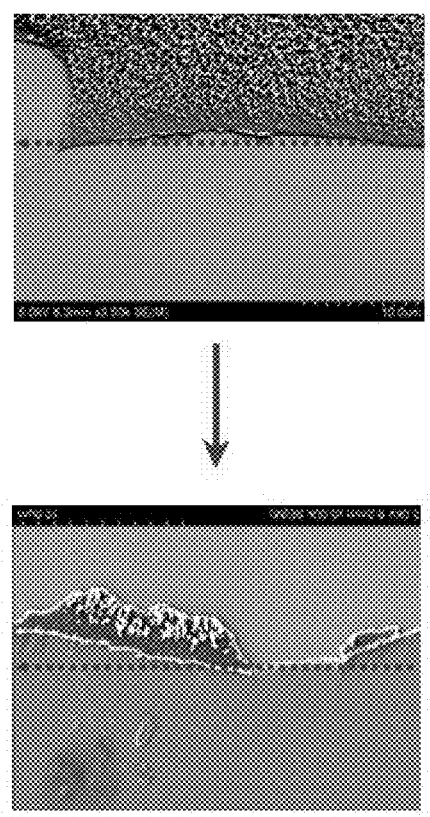
FIG. 5 shows scanning electron microscope (SEM) images showing results according to Example.

FIG. 5 shows SEM images showing the above process. The upper image of FIG. 5 shows a state before the ALD layer was removed with the first polymer layer, and the lower image of FIG. 5 shows a state after the ALD layer was removed with the first polymer layer.

In the drawings, a dotted line represents a boundary between a part in which the first polymer layer was formed and a part in which the first polymer layer was not formed, an upper part of the drawing divided by the dotted line represents the part in which the ALD layer was formed with the first polymer layer, and the lower part of the drawing divided by the dotted line represents the part in which only the ALD layer was formed.

It is seen that the first polymer layer formed in the pad region in the drawing was completely removed with the ALD layer, but the ALD layer in the part in which the first polymer layer was not formed remained.

Results of elemental analysis to the lower part of FIG. 5 using an EDS element analyzer are summarized in Table 1.

As shown in Table 1, in the region (pad region) from which the ALD layer was removed with the first polymer layer, aluminum (Al), which is a component of the ALD layer, was not observed, and therefore it was confirmed that the corresponding component was completely removed.

TABLE 1

| | Pad region | | | Device region | |
|---|---|---|---|---|---|
| Element | Weight % | Atomic % | Element | Weight % | Atomic % |
| C | 35.53 | 51.15 | O | 62.78 | 87.45 |
| O | 43.47 | 46.99 | Al | 9.67 | 7.99 |
| Pt | 20.99 | 1.86 | K | 3.11 | 1.77 |
| | | | Pt | 24.44 | 2.79 |
| Totals | 100.00 | 100.00 | Totals | 100.00 | 100.00 |

EXAMPLE 2

An OED was manufactured by the same method as described in Example 1, but after a first polymer layer was deposited, a second polymer layer was also formed by iCVD using glycidyl methacrylate (GMA) as a monomer in a region in which the first polymer layer was not deposited through a masking process, an ALD layer was formed, and then the first polymer layer was delaminated using a pressure-sensitive adhesive sheet. Results were analyzed by the same method as described in Example 1, and it was confirmed that only the ALD layer was completely removed from the part having the first polymer layer formed as described in Example 1.

COMPARATIVE EXAMPLE 1

Figure 6:
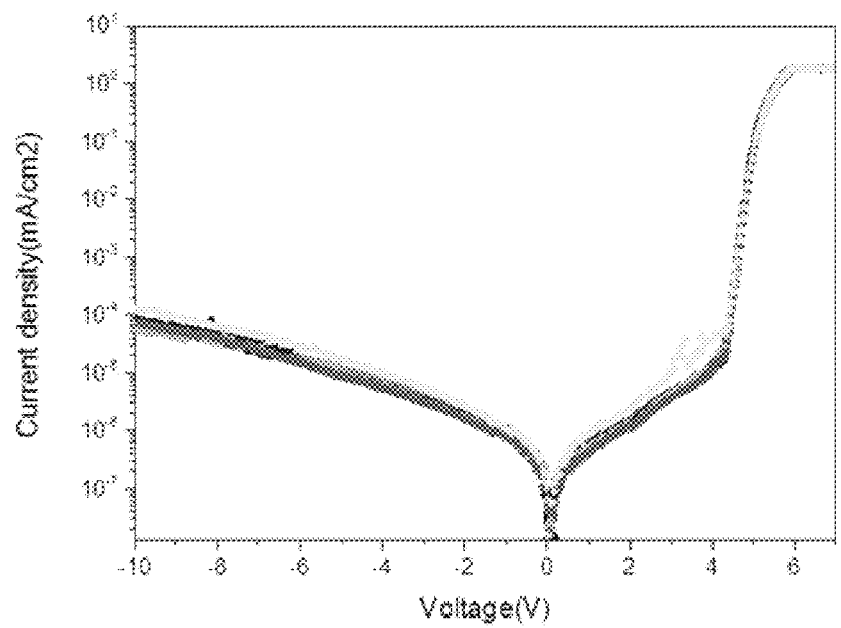
FIGS. 6 and 7 are graphs showing comparison of J-V curves according to Example 1 and Comparative Example 1.
Figure 7:
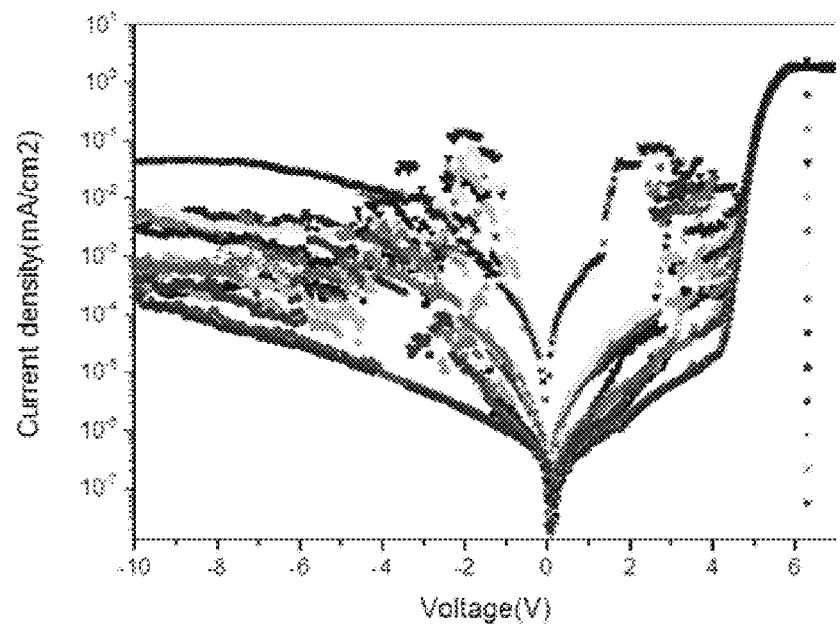

An OED was manufactured by the same method as described in Example 1, except that a pressure-sensitive adhesive pad was added to a pad region without an iCVD film, and the pad region was exposed by delaminating the pressure-sensitive adhesive pad. Comparison of performance between the device manufactured in Comparative Example 1 and the device manufactured in Example 1 is shown in FIGS. 6 and 7. FIG. 6 is a J-V curve according to Example 1, and FIG. 7 is a J-V curve according to Comparative Example 1. As confirmed from the comparison in FIGS. 6 and 7, Example 1 obtained a stable J-V curve, but Comparative Example 1 obtained an unstable J-V curve due to permeation of an external material by the pressure-sensitive adhesive pad.

EXPLANATION OF THE MARKS IN FIGURES

101: the substrate
201: the device region
301: the pad region
2011: the first electrode layer
2012: the organic layer
2013: the second electrode layer
2014: the insulating layer
401: the first polymer film
501: the inorganic layer

What is claimed is:

1. An organic electronic device (OED), comprising:
a substrate;
a device region formed on the substrate, and including a first electrode layer, an organic layer, and a second electrode layer, which are sequentially stacked;
a pad region formed on the substrate, and electrically connected to the first or second electrode layer;
an inorganic material layer formed in the device region; and
a first polymer film present in the pad region, and including a halogenated hydrocarbon group or a hydrocarbon group.

2. The OED according to claim 1, comprising:
a second polymer film formed between the device region and the inorganic material layer.

3. The OED according to claim 2, wherein the second polymer film includes a hydroxyl group, an epoxy group, an amino group, or a carboxyl group.

4. A light source for a display, comprising:
the OED of claim 1.

5. A lighting device, comprising:
the OED of claim 1.

6. A method of manufacturing an organic electronic device (OED), comprising:
forming a first polymer film at least in a pad region of a substrate on which a device region including a first electrode layer, an organic layer, and a second electrode layer, which are sequentially stacked, and the pad region electrically connected to the first or second electrode layer are formed;
forming an inorganic material layer on the substrate; and
removing the first polymer film to expose the pad region.

7. The method according to claim 6, wherein the first polymer film is formed by initiated chemical vapor deposition (iCVD).

8. The method according to claim 7, wherein the first polymer film is formed under a pressure of 200 mT to 1 T.

9. The method according to claim 6, wherein the first polymer film is formed to have a thickness of 100 nm or more.

10. The method according to claim 6, wherein the first polymer film includes a hydrocarbon group or a halogenated hydrocarbon group.

11. The method according to claim 6, wherein the first polymer film is formed using a compound of Formula 1:

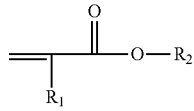

[Formula 1]

where $R_1$ is hydrogen or an alkyl group, and $R_2$ is a hydrocarbon group which is not substituted or substituted by at least one halogen atom.

12. The method according to claim 6, wherein the inorganic material layer is formed by atomic layer deposition (ALD).

13. The method according to claim 6, wherein the inorganic material layer is a barrier layer.

14. The method according to claim 6, further comprising:
before forming an inorganic material layer,
forming a second polymer film in the device region.

15. The method according to claim 14, wherein the second polymer film includes a hydroxyl group, an epoxy group, an amino group, or a carboxyl group.

16. The method according to claim 14, wherein the second polymer film is formed of a carboxyl group-containing monomer such as hydroxyalkyl (meth)acrylate or hydroxypolyalkyleneglycol (meth)acrylate, a glycidyl group-containing monomer, or an amide-based monomer.

* * * * *